US 11,017,848 B2

United States Patent
Jain et al.

(10) Patent No.: US 11,017,848 B2
(45) Date of Patent: May 25, 2021

(54) STATIC RANDOM-ACCESS MEMORY (SRAM) SYSTEM WITH DELAY TUNING AND CONTROL AND A METHOD THEREOF

(71) Applicant: Samsung Electronics Co., Ltd., Suwon-si (KR)

(72) Inventors: Ambuj Jain, Bangalore (IN); Akash Kumar Gupta, Bangalore (IN); Manish Chandra Joshi, Bangalore (IN); Parvinder Kumar Rana, Bangalore (IN); Abhishek Kesarwani, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/720,888

(22) Filed: Dec. 19, 2019

(65) Prior Publication Data

US 2021/0118494 A1 Apr. 22, 2021

(30) Foreign Application Priority Data

Oct. 22, 2019 (IN) .............................. 201941042891

(51) Int. Cl.
*G11C 7/08* (2006.01)
*G11C 11/419* (2006.01)
(52) U.S. Cl.
CPC .................................. *G11C 11/419* (2013.01)
(58) Field of Classification Search
CPC ...................................................... G11C 7/222
USPC ......................................................... 365/194
See application file for complete search history.

(56) References Cited

U.S. PATENT DOCUMENTS

| | | | | |
|---|---|---|---|---|
| 5,996,041 | A * | 11/1999 | Kim ...................... | G11C 16/26 711/103 |
| 6,643,787 | B1 * | 11/2003 | Zerbe ...................... | G06F 1/10 713/400 |
| 9,105,328 | B2 | 8/2015 | Chiu et al. | |
| 9,928,889 | B1 * | 3/2018 | Narasimhan ......... | G11C 7/1075 |
| 2011/0110174 | A1 * | 5/2011 | Cho ....................... | G11C 7/222 365/194 |
| 2015/0269982 | A1 | 9/2015 | Chandra et al. | |

(Continued)

FOREIGN PATENT DOCUMENTS

CN 103745744 A 4/2014

OTHER PUBLICATIONS

Dave, Rachit, 6T-Sram Cell Leakage Current Analysis & Self-Timing Circuit in Memory, ResearchGate, May 2015, 1-43.

*Primary Examiner* — Min Huang
(74) *Attorney, Agent, or Firm* — Harness, Dickey & Pierce, P.L.C.

(57) ABSTRACT

Embodiments herein provide a Static Random-Access Memory (SRAM) system with a delay tuning circuitry and a delay control circuitry and a method thereof. Delay tuning circuitry in the SRAM system may provide a tuning of reset time in the generation of an internal clock by introducing a delay. The delay is introduced according to a process state of periphery circuitry in the SRAM. A delay control circuitry provides a control over delay in reset time of the internal clock by varying a discharge rate for each of a Dummy Bit Line (DBL) circuitry and Complementary Bit Line Circuitry (CDBL), by connecting a stack of NMOS transistors over discharge NMOS transistors.

20 Claims, 9 Drawing Sheets

(56) References Cited

U.S. PATENT DOCUMENTS

2015/0357013 A1\* 12/2015 Park ..................... G11C 11/419
                                                           365/203

\* cited by examiner

900 

Enabling, through a pass gate in the SRAM, a discharging state for each of a Dummy Bit Line (DBL) circuitry (1a) connected to one or more DBL load, and a Complementary Dummy Bit Line (CDBL) circuitry connected to one or more CDBL load the CDBL circuit 902

Controlling a delay in generation of an internal clock according to a rate of discharge of each of the DBL and the CDBL, through a stack of NMOS transistors connected to the DBL circuit 902

FIG. 9

STATIC RANDOM-ACCESS MEMORY (SRAM) SYSTEM WITH DELAY TUNING AND CONTROL AND A METHOD THEREOF

CROSS-REFERENCE TO RELATED APPLICATIONS

This application claims priority under 35 U.S.C. § 119 to Indian Patent Application No. 201941042891, filed on Oct. 22, 2019, in the Indian Intellectual Property Office, the disclosure of which is hereby incorporated by reference in its entirety.

BACKGROUND

Example embodiments herein relate, in general, to Static Random-Access Memory (SRAM), more particularly to delay tuning in SRAM.

Fabrication of semiconductor devices has progressed significantly over past few decades. Static Random-Access Memory (SRAM) is a widely used semiconductor device used for storing data in a static form. As opposed to Dynamic Random Access Memory (DRAM), an SRAM may not be periodically refreshed.

A typical SRAM system includes a core region and a periphery logic. The core region may include a plurality of bitcells that store logical memory. Each bitcell may include a number of transistors; for example, each bitcell may include six transistors (6T). For example, each bit cell may include two NMOS passgate transistors, 2 NMOS pulldown transistors, and 2 PMOS pullup transistors. The plurality of bitcells may be arranged in an array of rows and columns. Rows may be called word lines (WLs) and columns may be called bit lines (BLs). The periphery logic region may include row and column decode circuitry. Each bitcell, e.g. each of the six transistors, in the core region may have gone through a different manufacturing process than e.g. transistors in the periphery logic. The manufacturing process can be a slow manufacturing processing, or alternatively a fast manufacturing process, according to threshold voltages of transistors in the core region and of transistors in the periphery logic region. A worst-case scenario for read operations of the SRAM and write operations of the SRAM may correspond to a slow process for bitcell, e.g. bitcell transistors, and a fast process for periphery logic, e.g. periphery logic transistors.

The operation and performance of SRAM may depend on a self-timing internal clock of SRAM. A reset time of the internal clock determines the time taken by SRAM to perform read or write operation and this time varies according to the manufacturing process. The reset time plays an important role in an overall performance/cycle time of an SRAM. To qualify SRAM in the worst case scenario, more delay in reset for internal clock may be required or desired. This extra delay added for worst case scenario may cause a penalty in a nominal case, and thus performance of SRAM may be degraded.

Margin delay settings in SRAM system may be used for qualification for accessing different modes of operation in SRAM system. Generally known SRAM systems may be inefficient in providing control over margin delay control settings, and thus may not support qualifications of SRAM based on different performance requirements.

An object of some example embodiments herein is to provide a Static Random-Access Memory (SRAM).

Another object of example embodiments herein is to provide a delay tuning circuitry in the SRAM.

Another object of example embodiments herein is to provide a delay control circuitry in the SRAM.

SUMMARY

Accordingly, some example embodiments herein provide a delay tuning circuitry in a Static Random-Access Memory (SRAM). The delay tuning circuitry comprises a process sensing circuitry provided in a tracking circuitry of the SRAM, the process sensing circuitry including, an input clock configured to generate a clock input based on an internal clock, a voltage node configured to generate a voltage based on the clock input, a diode connected to the voltage node, wherein the voltage generated by the voltage node is proportional to a threshold voltage of the diode, the threshold voltage of the diode being based on a process state of the diode, and a contention P-type Metal Oxide Semiconductor (PMOS) configured to create a delay in a reset time of the internal clock according to the voltage generated at the voltage node of the diode circuitry.

Furthermore, some example embodiments herein provide a delay control circuitry in a Static Random-Access Memory (SRAM). The delay control circuitry comprises a Dummy Bit Line (DBL) circuitry connected to one or more DBL loads, a Complementary Dummy Bit Line (CDBL) circuitry connected to one or more CDBL loads, a pass gate configured to enable a discharging state for the DBL circuitry and for the CDBL circuitry, and a stack of NMOS transistors connected to the DBL circuitry, the stack of NMOS transistors configured to control a delay in generation of an internal clock according to a rate of discharge of each of the DBL circuitry and of the CDBL circuitry.

Still further, some example embodiments herein provide a method for tuning a reset time for an internal clock in a Static Random-Access Memory (SRAM). The method comprises an input clock configured to generate a clock input based on an internal clock, a voltage node configured to generate a voltage based on the clock input, a diode connected to the voltage node, wherein the voltage generated by the voltage node is proportional to a threshold voltage of the diode, wherein the threshold voltage is based on a process state of the diode, a contention P-type Metal Oxide Semiconductor (PMOS) configured to create a delay in a reset time of the internal clock according to the voltage generated at the voltage node of the diode, and a delay control circuitry. The delay control circuitry includes a Dummy Bit Line (DBL) circuitry connected to one or more DBL load, a Complementary Dummy Bit Line (CDBL) circuitry connected to one or more loads, a pass gate configured to control a discharging state for each of the DBL circuitry and the CDBL circuitry, and a stack of NMOS transistors connected to the DBL circuitry, the stack of NMOS transistors configured to control a delay in a generation of an internal clock according to a rate of discharge of each of the DBL circuitry and the CDBL circuitry.

Still further, some example embodiments herein provide a method for controlling delay in reset time of internal clock in a Static Random-Access Memory (SRAM). The method comprises configuring, in a tracking circuitry of the SRAM; a process sensing circuitry, triggering, through an input clock in the SRAM, a clock input; generating, through a voltage node, a voltage through the clock input, wherein the voltage is proportional to a threshold voltage of a diode connected to the voltage node, wherein the threshold voltage is defined through a process state of the diode; and creating, through a contention P-type Metal Oxide Semiconductor (PMOS), a delay in reset time of the internal clock according to the voltage generated at the voltage node of the diode circuitry.

Still further, some example embodiments herein provide a Static Random-Access Memory (SRAM) comprising enabling, through a pass gate in the SRAM, a discharging state for each of a Dummy Bit Line (DBL) circuitry connected to one or more DBL load, and a Complementary Dummy Bit Line (CDBL) circuitry connected to one or more CDBL load the CDBL circuitry; and controlling, through a stack of NMOS transistors connected to the DBL circuitry, a delay in generation of an internal clock, the controlling being according to a rate of discharge of each of the DBL and the CDBL circuitry.

These and other aspects of example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of example embodiments herein without departing from the spirit thereof, and example embodiments herein include all such modifications.

BRIEF DESCRIPTION OF DRAWINGS

The delay tuning circuitry, delay control circuitry, Static Random-Access Memory (SRAM), and method are illustrated in the accompanying drawings, throughout which like reference letters indicate corresponding parts in the various figures. Example embodiments herein will be better understood from the following description with reference to the drawings, in which:

FIG. 9 illustrates a process flow for a method for controlling delay in generation of an internal clock in the SRAM, according to some example embodiments disclosed herein.

DETAILED DESCRIPTION

Figure 1:
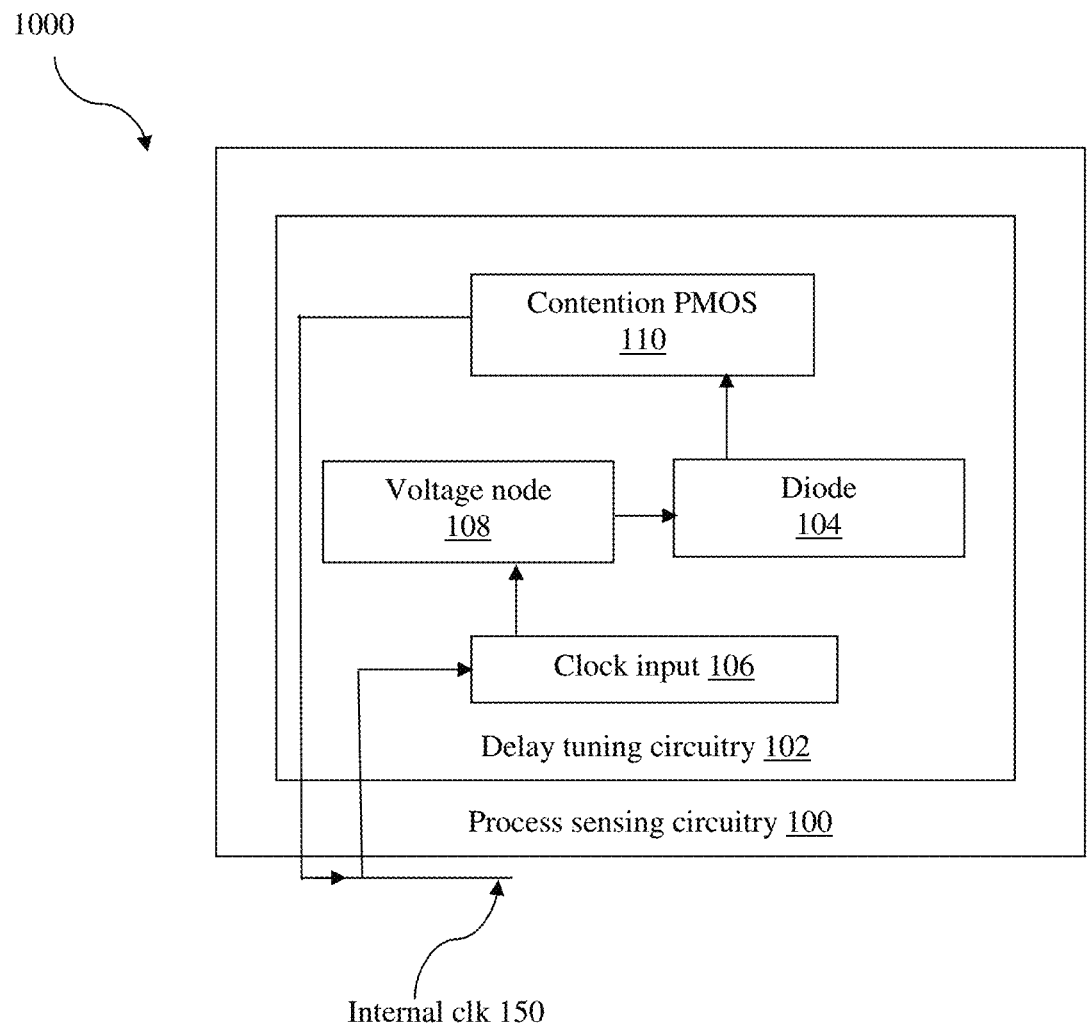
FIG. 1 illustrates a block diagram of a delay tuning circuitry in a Static Random-Access Memory (SRAM), according to some example embodiments disclosed herein.

Example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure example embodiments herein. Also, the various example embodiments described herein are not necessarily mutually exclusive, as some example embodiments can be combined with one or more other embodiments to form new embodiments. The term "or" as used herein, refers to a non-exclusive or, unless otherwise indicated. The examples used herein are intended merely to facilitate an understanding of ways in which example embodiments herein can be practiced and to further enable those of ordinary skill in the art to practice example embodiments herein. Accordingly, the examples should not be construed as limiting the scope of example embodiments herein.

As used herein, the term "circuitry" may include, without limitation, electronic components, for example hardware fabricated on a substrate. Electronic components can include, for example, electrical components such as transistors, resistors, capacitors, and/or inductors. The electrical components can be arranged in logic gates such as NAND gates and/or NOR gates and/or NOT gates. Inventive concepts are not limited thereto, and the term "circuitry" may include, for example, a hardware/software combination such as a processor executing software. For example, certain elements described as circuitry more specifically may include, but are not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

Accordingly, example embodiments herein provide a Static Random-Access Memory (SRAM) with a delay tuning circuitry, and/or a delay control circuitry in the SRAM. The proposed SRAM provides a tuning of delay time in resetting internal clocks, according to a process type/condition of periphery devices. The proposed SRAM also provides a control over delay time in reset of the internal clock according to Margin Control Setting (MCS) requirement in the SRAM.

Some example embodiments are explained considering that the SRAM system (hereafter referred as system) may be implemented as a memory system inside any processing system, and may also be implemented in a variety of computing systems, such as a laptop computer, a desktop computer, a notebook, a workstation, a mainframe computer, a server, a network server, and/or the like. It will be understood that the system may be accessed by multiple users through one or more user devices, and/or applications residing on the user devices. Examples of the user devices may include, but are not limited to, a portable computer, a personal digital assistant, a handheld device, and/or a workstation. The user devices may be communicatively coupled to the proposed system through a network.

The proposed SRAM includes a high-speed memory configured to fetch data based on an address. The high-speed memories may be used inside a processor, microcontroller and electronic unit. The SRAM may be used as one of a cache, buffer FIFO, and/or LIFO type of memories.

Referring now to the drawings, and more particularly to FIGS. 1 through 9, there are shown some example embodiments.

Referring to FIG. 1, an SRAM 1000 may include a delay tuning circuitry 102 and circuitry a process sensing circuitry 100 configured in the tracking circuitry of the periphery circuitry (not shown in drawings). The circuitry delay tuning circuitry 102 comprises a diode 104 configured to sense a process type of the periphery circuitry. The process type may correspond to one of a fast process or a slow process, and may be embodied based on a strength, e.g. a threshold voltage, of transistors used in fabrication of the SRAM 1000. The diode 104 may be controlled by a clock input 106, or en_ps. The input clock may ensure that the diode 104 is turned on only when the SRAM 1000 is performing one or more operations, for example, at least one of a read operation and a write operation.

Figure 2:
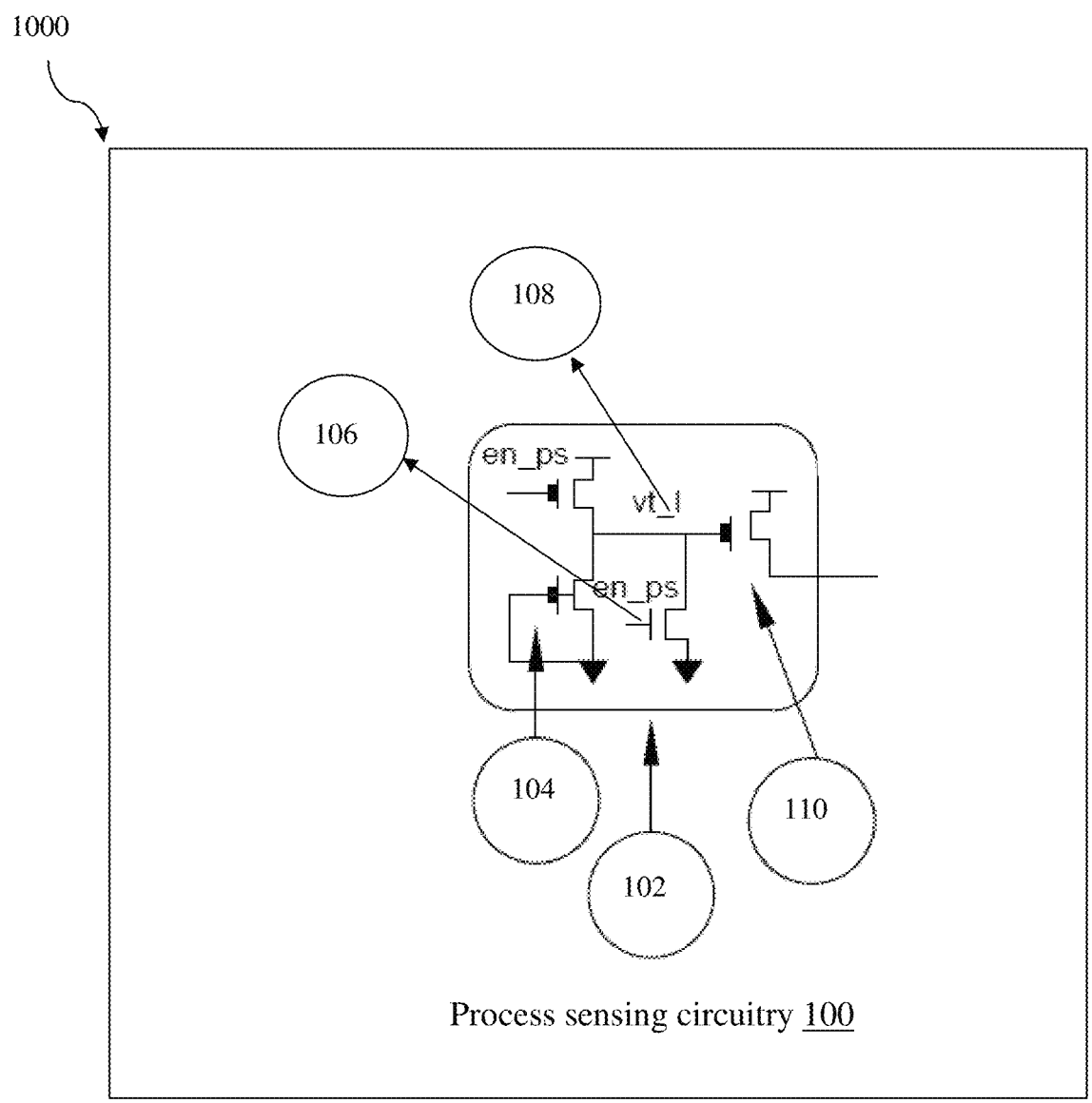
FIG. 2 illustrates details of circuitry of the delay tuning circuitry of FIG. 1, according to some example embodiments disclosed herein.

Referring to FIG. 2 in combination with FIG. 1, details of the delay tuning circuitry 100 are discussed. The SRAM 1000 may function through a customer-based external clock (not shown). The external clock may generate the internal clock 150. For example, the internal clock 150 may be generated according to one or more users actions for performing one of the read operation or the write operation. Each of the read operation and the write operation may be performed according to a respective read margin and a write margin. Each of the read margin and the write margin may be defined in terms of a sigma number. The sigma number defines the probability of failure of the SRAM 1000. For example, the sigma number may refer to an amount of standard deviation associated with a process capability of the SRAM 1000.

An SRAM may be fabricated to operate with fast or slow NMOS transistors and PMOS transistors, for example based on respective threshold voltages of the NMOS transistors and the PMOS transistors. The SRAM may be characterized as operating in a corner associated with the speed of the NMOS transistors and a speed of the PMOS transistors. A worst case corner for each of the read margin and the write margin may be defined as a case when a bitcell is manufactured at a slow process (e.g., with transistors having a relatively high threshold voltage or high absolute value of a threshold voltage), and the periphery circuitry is manufactured at a fast process (e.g., with transistors having a relatively low threshold voltage or low absolute value of a threshold voltage). For example, transistors having a relatively high threshold voltage may have ion implantation conditions and/or gate lengths from photolithographic conditions different than transistors having a relatively low threshold voltage. Each chip of the SRAM 1000 may be required to qualify the worst-case scenario in accordance with the process type.

The internal clock 150 may be reset according to the delay time (also referred as delay). The internal clock 150 may also be referred as a self-timed clock. In order to qualify the worst-case scenarios for each of the read margin and the write margin, the reset time of the internal clock 150 may need to, or desired to, be increased. The reset time may be increased by controlling a delay time in generation of the reset signal for the internal clock 150. Increasing delay in the reset time of internal clock 150 may result in a penalty in the performance of the SRAM 1000. Thus, to qualify for the worst case process conditions, there might be a performance loss in normal operational case of the SRAM 1000, where each of the bitcell and the periphery circuitry are on a nominal process corner, as opposed to the slow process corner or the fast process corner. The proposed delay tuning circuitry 102 controls the reset time of the internal clock 150 according to the process type, and thus may control the performance loss.

Still referring to FIG. 1 and FIG. 2 in combination, in the proposed delay tuning circuitry 102, the internal clock 150 triggers the clock input 106. The clock input 106 may be referred as the en_ps. Each of the clock inputs 106 shown in FIG. 2, when triggered, turns on the diode 104 at an active edge of the external clock. The diode 104 comprises a PMOS diode; e.g. the diode 104 may include a PMOS transistor wherein a gate of the PMOS transistor is connected to a source of the PMOS transistor. When the diode 104 is turned on, the diode 104 generates a voltage at the voltage node 108. The voltage node 108 is referred as vt_l.

The voltage generated by the voltage node 108 may be proportional to the threshold voltage of diode 104, e.g. of the PMOS transistor used in the diode 104. The periphery circuitry may be at one of the Fast Fast (FF) process, Slow Fast (SF) process, Fast Slow (FS) process or Slow Slow (SS) process. Herein the first letter (such as F in the FF process, S in the SF process, F in the FS process and S in the SS process) denotes a process corner for the NMOS transistors and the second letter (such as F in the FF process, F in the SF process, S in the FS process and S in the SS process) denotes a process corner for PMOS transistors. F denotes a fast corner and an S denotes slow corner. For example, an FF process or FF corner denotes fast NMOS transistors having a relatively low threshold voltage and fast PMOS transistors having a relatively low threshold voltage in absolute value, whereas an SF process or SF corner denotes slow NMOS transistors having a relatively high threshold voltage and fast PMOS transistors having a relatively low threshold voltage in absolute value. The voltage generated at voltage node may be at a relatively lower level when the process state of the PMOS diode is at the fast process, whereas the voltage generated at voltage node may be at a relatively higher level when the process state of the PMOS diode is the slow process.

The voltage generated at voltage node 108 is applied to a gate of a contention PMOS 110 as shown in FIG. 2. The drain of the contention PMOS 110 may be connected to a Complementary Dummy Bit Line (CDBL) and may create a contention in discharging of the CDBL through an NMOS connected to DWL (shown later in FIG. 4 and FIG. 5). Since at the fast PMOS process, a voltage applied to the gate of the contention PMOS 110 may be lower (e.g. lower in absolute value) than that of a slow PMOS process, a current flowing through the contention PMOS 110 is more than that of a slow PMOS process (e.g. the contention applied to CDBL is more than that of a slow PMOS process). Furthermore, at the slow PMOS process, the voltage applied to the gate of the contention PMOS 110 is more, and current flowing through the contention PMOS 110 is less (e.g. the contention applied to the CDBL is less). Thus, an amount of the contention applied by the contention PMOS 110 will change a discharge rate of the CDBL. Accordingly reduced discharge rate of the CDBL may result in the increased delay of rest time.

In some example embodiments, whenever the periphery circuitry of the SRAM 1000 is manufactured at the fast corner (fast process corner), the proposed delay tuning circuitry 102 identifies the process state as the fast process, and may generate more delay in the rest time of internal clock 150. For example, the proposed delay tuning circuitry 102 according to example embodiments may have transistors used in the periphery circuitry of the SRAM 1000 along with the transistor used in the diode 104 manufactured according to the fast process corner. Thus, more delay, e.g. extra delay, helps in fixing a worst case scenario of each of the read margin and the write margin discussed above. On the other hand, when the periphery circuitry is manufactured at the slow process the proposed delay tuning circuitry 102 identifies the state as the slow process and generates very less delay in the reset time of internal clock 150. For example, the proposed delay tuning circuitry 102 according to example embodiments may have transistors used in the periphery circuitry of the SRAM 1000 along with the transistor used in the diode 104 fabricated according to the slow process corner. A variation in the reset time, or a delay of the internal clock 150 based on the process state may help in qualifying the worst case for each of the read margin and the write margin, while reducing the penalty at performance corner.

In another example embodiment, in case of a dual rail SRAM 1000, the contention PMOS 110 may be controlled by a voltage supply from the periphery circuitry, referred as VDDPE supply. A Dummy Word Line (DWL) may be controlled by a voltage supply from a core circuitry (also referred as VDDCE supply or core supply). Thus, in case the VDDPE is more than VDDCE, more contention may be provided by the contention PMOS 110 as compared to a case where the VDDCE is more than VDDPE. A worst case scenario in terms of voltage in dual rail SRAM may be defined as a case when the VDDPE is higher than the VDDCE, because periphery circuitry will be faster and bitcell will be slower. Thus, the proposed delay tuning circuitry 102 may also improve each of the read margin and the write margin worst case in dual rail SRAM 1000.

TABLE 1

| Periphery logic voltage in volts | Core logic voltage in volts | Periphery process | Delay introduced by the proposed delay tuning circuitry 102 (in picoseconds) |
|---|---|---|---|
| 0.79 | 0.66 | SS | 6.32 |
| 0.79 | 0.66 | FF | 21 |
| 0.79 | 0.66 | FS | 2.92 |
| 0.79 | 0.66 | SF | 48.9 |
| 0.53 | 0.66 | SS | 0 |
| 0.53 | 0.66 | FF | 2.6 |
| 0.53 | 0.66 | FS | 1.67 |
| 0.53 | 0.66 | SF | 3.27 |

In accordance with some example embodiments, Table 1 above shows a generation of delay through the delay tuning circuitry 102 according to different value of voltage and process state of the diode.

As shown in Table 1, more delay may be introduced when a difference between the VDDPE and the VDDCE is large. An increment in the delay in order of delay for SF states is greater than delay for FF states, delay for FF states is greater than delay for SS states, and delay for SS states is greater than delay for FS states.

In an example embodiment, an output of the delay control circuitry is passed on to a sense amplifier 412 (shown in the FIG. 5) in the SRAM 1000. The sense amplifier 412 includes a module configured to sense a difference in voltage at a bit line and a complementary bit line of the bitcell. This difference in voltage may also be called a differential voltage. A minimum differential voltage that the sense amplifier 412 can amplify may be determined by an offset and/or intrinsic noise of the sense amplifier. The sense amplifier 412 is triggered by a signal referred as a sense enable or SA_EN. The sense enable is generated in the tracking module through the delay tuning circuitry 102.

To qualify a worst-case corner, for example, a worst case scenario for read margin corresponding to the periphery logic at the fast process and core logic at the slow process, more differential voltage at the sense amplifier 412 may be desired. For the larger differential voltage, more delay in generation of the SA_EN signal may be used. Thus, the delay tuning circuitry 102 generates the delay in case of the worst-case scenario for the read margins, while having no or a small impact on other performance corners—e.g. the periphery at slow process and core also at slow process.

Figure 3A:
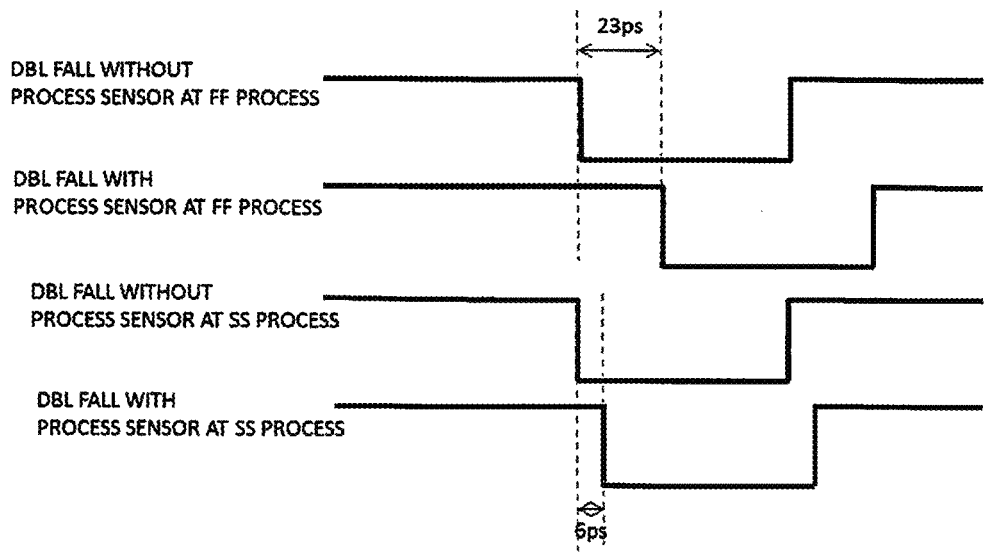
FIG. 3(a) shows waveform for delay in the generation of the internal clock according to different process of the periphery circuitry, according to some example embodiments as disclosed herein.
Figure 3B:
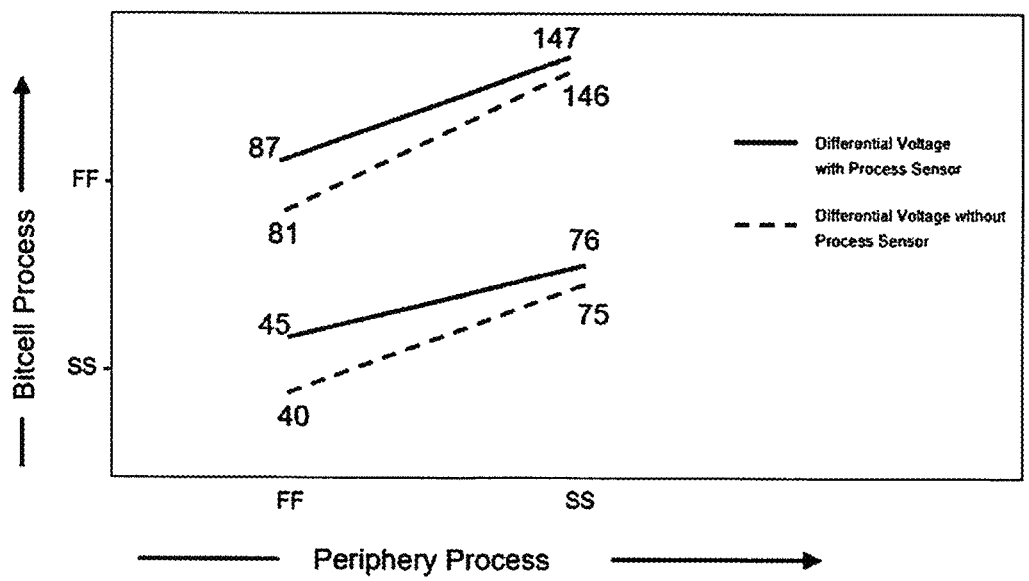
FIG. 3(b) shows graph for sense amplifier differential generation according to different process states, according to some example embodiments as disclosed herein.

FIG. 3(a) shows waveform for delay in the generation of the internal clock 150 according to different processes of the periphery circuitry. For fast periphery, delay is 21.3 picoseconds (ps), and for slow periphery delay introduced is 6.3 ps. FIG. 3(b) shows graph for the sense amplifier 412 differential generation according to different process state. As shown in FIG. 3(b), there is less sensitivity in performance when having a differential voltage with a process sensor.

Figure 4:
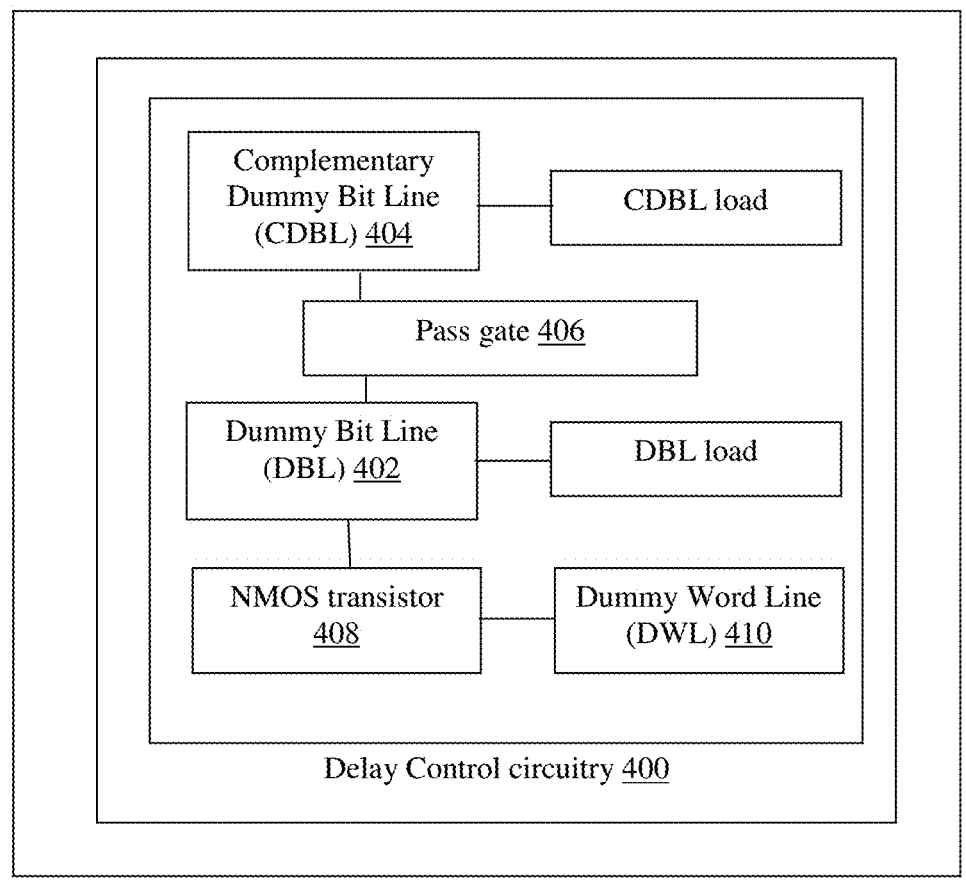
FIG. 4 illustrates a block diagram of a delay control circuitry in the SRAM, according to some example embodiments as disclosed herein.
Figure 5:
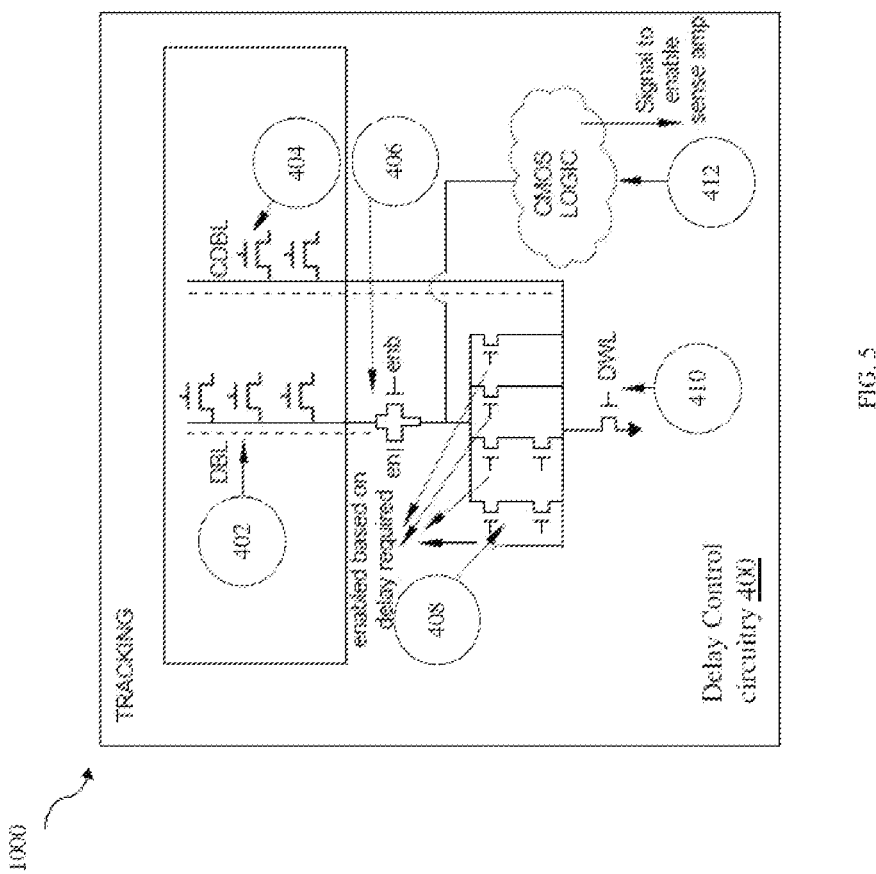
FIG. 5 illustrates details of circuitry of the delay control circuitry of FIG. 4, according to some example embodiments disclosed herein.

In some example embodiments, referring to FIG. 4, a block diagram of the SRAM 1000 with a delay control circuitry 400 is shown, and FIG. 5 shows a circuitry diagram of the delay control circuitry in the SRAM 1000. The delay control circuitry 400 is configured in the tracking module, e.g. the self-time tracking module, of the SRAM 1000. The delay control circuitry 400 comprises a Dummy Bit Line (DBL) circuitry 402 connected to one or more DBL load, a Complementary Dummy Bit Line (CDBL) 404 connected to one or more CDBL load, and a pass gate 406 enabling discharge of each of the DBL load and the CDBL load. Each of the DBL circuitry 402 and the CDBL circuitry 404 comprises one or more NMOS transistors 408, and each of the DBL circuitry 402 and the CDBL circuitry 404 are configured to track Bit line (BL) signals in the SRAM 1000. As used herein a Dummy Bit Line may refer to a bit line that is not connected to a memory cell that will be used to store data during operation of the SRAM 1000. Similarly, as used herein a Dummy Word Line may refer to a word line that is not connected to a memory cell that will be used to store data during operation of the SRAM 1000. Either or both of Dummy Bit Lines and Dummy Word Lines may be electrically floating during operation of the SRAM 1000. An output of the delay control circuitry 400 may be connected to the sense amplifier of the SRAM 1000. The sense amplifier is enabled through a CMOS amplifier.

The delay control circuitry 400 further comprises the stack of NMOS transistors 408 connected to the DBL circuitry 402. The stack of NMOS transistors 408 are configured to control the delay in generation of the internal clock 150. The stack of NMOS transistors 408 are connected above discharge NMOS transistors. The discharge NMOS transistors are controlled by the Dummy Word Line (DWL) circuitry 410. The DWL circuitry 410 is circuitry for generating each DWL 410 for triggering the NMOS in the stack of NMOS transistors 408. The NMOS transistors in the stack of NMOS transistors 408 then discharge each of the CDBL circuitry 404 and the DBL circuitry 402. The contention PMOS 110 (as discussed above in FIG. 1 and FIG. 2) creates the contention for discharge of each of the DBL load and the CDBL load through the NMOS transistors in the stack of NMOS transistors 408 only. Connection of the stack of NMOS transistors 408 above the discharge NMOS transistors may improve an increment in delay. The stack of NMOS transistors 408 comprises one or more NMOS transistors for enabling a discharge path for each of the DBL circuitry 402 and the CDBL circuitry 404.

Still referring to FIG. 4 and FIG. 5 in combination, the pass gate 406 is configured to enable the discharge of at least one of the DBL circuitry 402 and the CDBL circuitry 404 through one or more select signals for disconnecting the at least one of the DBL load and the CDBL load. Discharge is performed through the stack of NMOS transistors 408. By disconnecting at least of the DBL load and the CDBL load, the pass gate 406 controls discharge time of at least one the DBL circuitry 402 and the CDBL circuitry 404. The select signal may be referred as en and enb (as shown in FIG. 5). Each of the en and enb are generated from Margin Control Setting (MCS) pins.

The select signals disconnect the at least one of the DBL signal and the CDBL signal based on the MCS pin setting. The MCS pin setting generates the select signals by enabling a discharge path through one or more NMOS transistors in the stack of NMOS transistors.

The MCS pins may be set by a user to one of a 00 state, a 01 state, a 10 state, and a 11 state. For each of the 00 state, the 01 state, the 10 state and the 11 state, delay in the generation of the internal clock 150 may be different. The delay may be increased when the MCS pin setting is changed from 01 state to one of the 10 state, the 10 state, or the 11 state. If one of the slower states (the 01 state, the 10 state, or 11 state) is set through the MCS pin, the delay in generation of the internal clock 150 may be increased. For a fastest state, i.e. the 00 state, only DBL load is discharged through the stack of NMOS transistors.

For each of the 01 state, 10 state and 11 state, one or more transistors in the stack of NMOS transistors 114 is enabled to enable the discharge path and the select signals are generated for enabling the discharge of each of the DBL circuitry 402 and the CDBL circuitry 404. The discharge of each of the DBL circuitry 402 and the CDBL circuitry 404 increases the discharge time in the delay control circuitry 400 thereby increasing delay in reset time of the internal clock 150 (or generation of the internal clock 150). Output of the delay control circuitry is then passed to the sense amplifier 412 to enable the sense amplifier 412 in the SRAM 1000.

Figure 6:
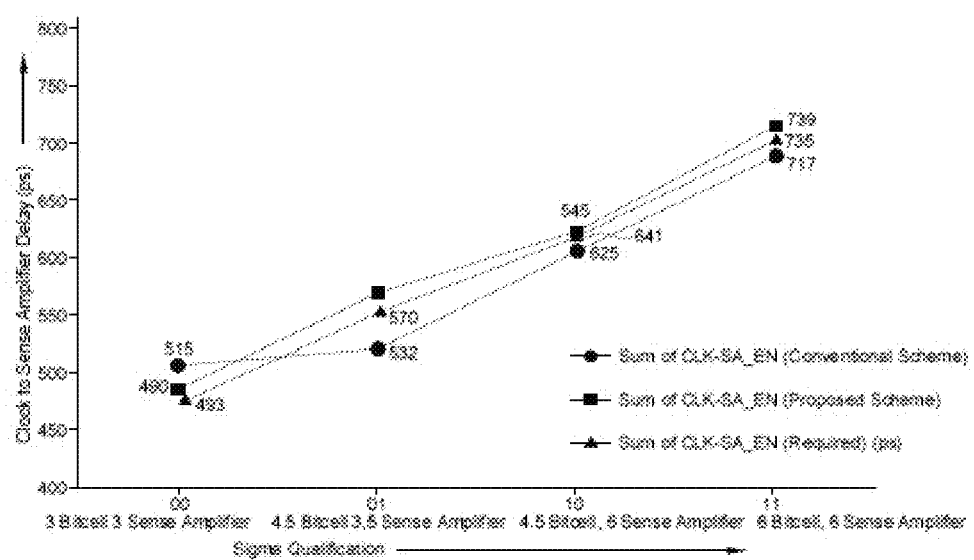
FIG. 6 shows a graph for internal clock to sense amplifier enable for different value of sigma qualification versus internal clock to sense amplifier delay (in picoseconds), according to some example embodiments disclosed herein.

In accordance with some example embodiments, referring to FIG. 6, a graph for the internal clock 150 to the sense amplifier enable for different value of sigma qualification versus the internal clock 150 to sense amplifier delay (in picoseconds) is shown. The graph shows an increment in delay in reset time for internal clock 150 from 00 sigma qualification (having 3 bitcells and 3 sense amplifiers) to each of 01 sigma qualification (having 4.5 bitcells and 3.5 sense amplifiers), 10 sigma qualification (having 4.5 bitcells and 6 sense amplifiers), and 11 sigma qualification (having 6 bitcells and 6 sense amplifiers).

Figure 7:
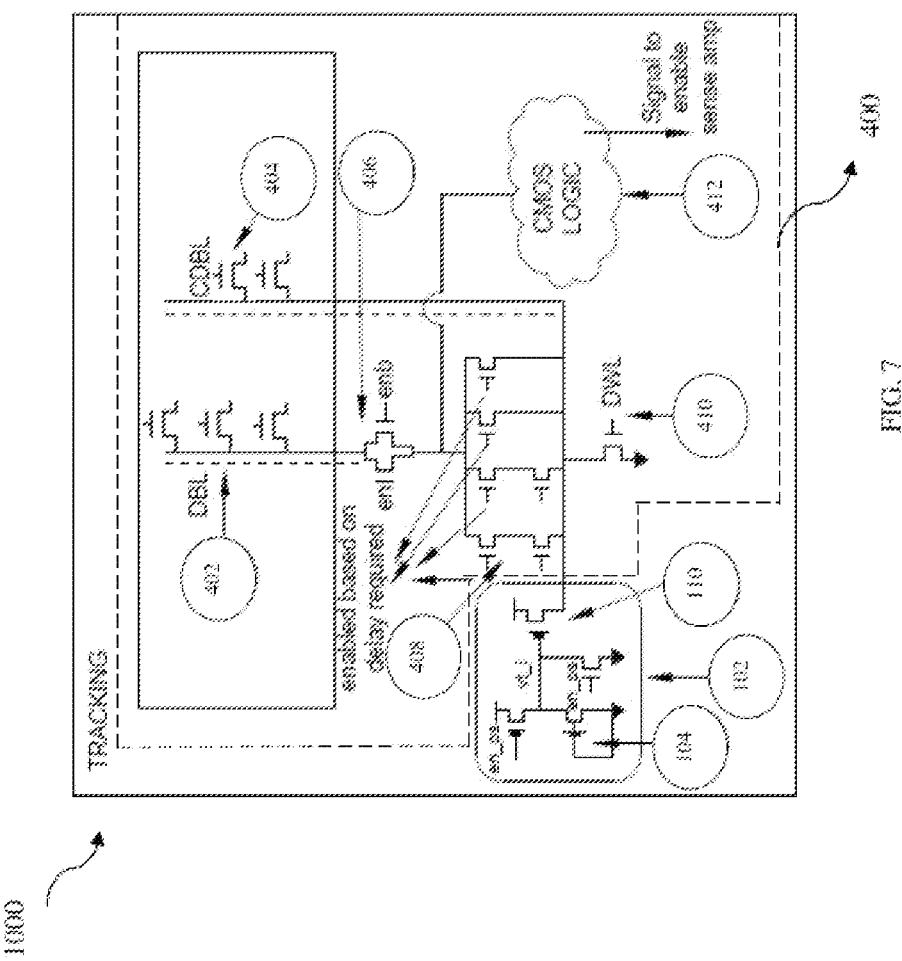
FIG. 7 illustrates the SRAM with each of the delay tuning circuitry of FIG. 2 and the delay control circuitry of FIG. 5, according to some example embodiments disclosed herein.

In accordance with some example embodiments, referring to FIG. 7, the SRAM 1000 with each of the delay tuning circuitry 100 and the delay control circuitry 400 is shown. The delay tuning circuitry 100 and the delay control circuitry 400 are explained above and are not repeated for the sake of brevity.

Figure 8:
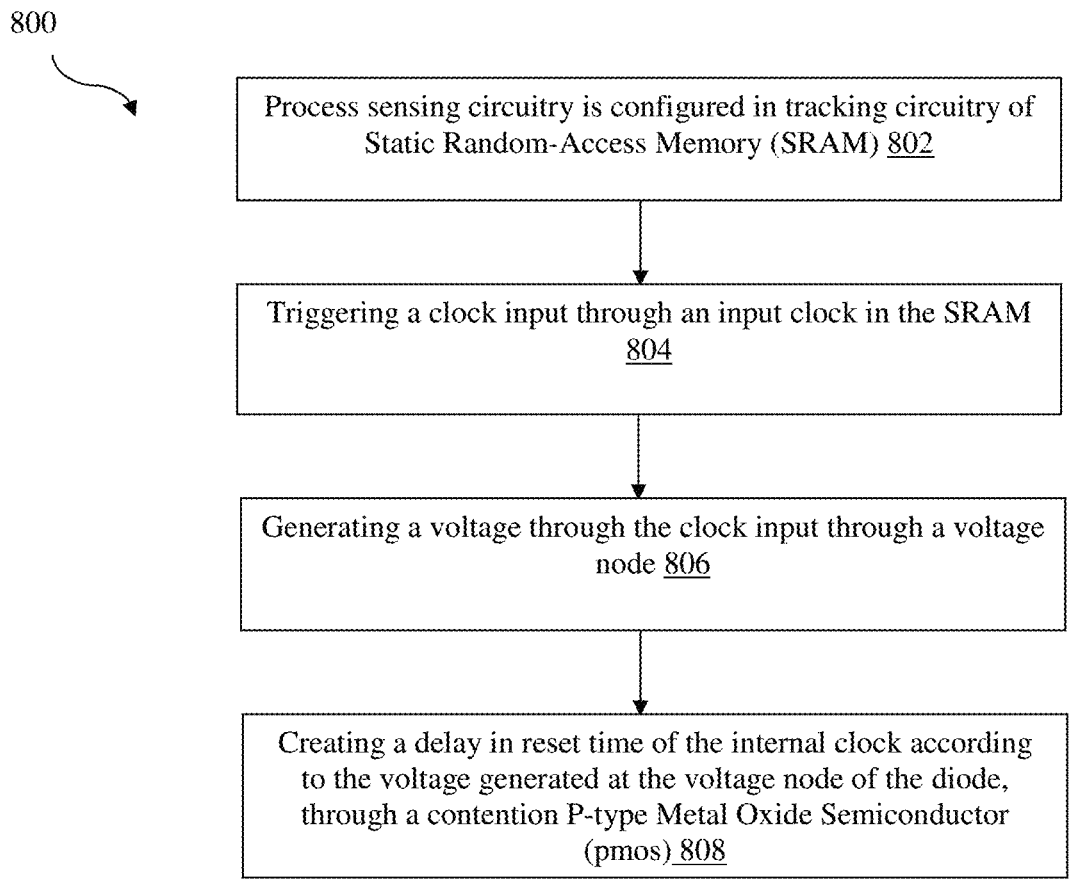
FIG. 8 illustrates a process flow for a method for tuning delay in generation of an internal clock in the SRAM, according to some example embodiments disclosed herein.

Referring to FIG. 8, a method 800 for tuning a delay in generation of internal clock 150 in Static Random-Access Memory (SRAM) 1000 is shown. The method 800 may be executed through the delay tuning circuitry 100 as discussed above. At step 802, the method 800 provides triggering of the clock input (en_ps) through the input clock in the SRAM 1000.

At step 804, a voltage through the voltage node (vt_l) 108 is generated through the clock input. The voltage is proportional to the threshold voltage of the diode 104 connected to the voltage node 108 and the threshold voltage is defined through the process state of the diode 104.

At step 806, the delay in reset time of the internal clock 150 is created according to the voltage generated at the voltage node 108 of the diode 104. The delay is created through the contention P-type Metal Oxide Semiconductor (PMOS) 110.

Details of the method 800 are similar to details of the delay tuning circuitry 100 and hence are not repeated for the sake of brevity.

Referring to FIG. 9, a method 900 for controlling a delay in generation of an internal clock 150 in the SRAM 1000 is shown. The method 900 may be executed by the delay control circuitry 400 in the SRAM 1000 as discussed above.

At step 902, the discharging state for each of the Dummy Bit Line (DBL) circuitry 402 connected to one or more DBL load and the Complementary Dummy Bit Line (CDBL) circuitry 404 connected to one or more CDBL load the CDBL circuitry 404 is enabled through the pass gate 406 in the SRAM 1000.

At step 904, the delay in generation of the internal clock 150 is controlled through the stack of NMOS transistors 408 connected to the DBL circuitry 402. The delay is controlled according to the rate of discharge of each of the DBL circuitry 402 and the CDBL circuitry 404.

Details of the method 900 are similar to details of the delay control circuitry 400 and hence are not repeated for the sake of brevity.

Example embodiments disclosed herein can be implemented using at least one software program running on at least one hardware device and are used to control the elements.

The foregoing description of the specific embodiments will so fully reveal the general nature of example embodiments herein that others can, by applying current knowledge, readily modify and/or adapt for various applications such specific example embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while example embodiments herein have been described, those of ordinary skill in the art will recognize that example embodiments herein can be practiced with modification within the spirit and scope of example embodiments as described herein.

We claim:

1. A delay tuning circuitry in a Static Random-Access Memory (SRAM), the delay tuning circuitry comprising:
   a process sensing circuitry provided in a tracking circuitry of the SRAM, the process sensing circuitry including,
   an input clock configured to generate a clock input based on an internal clock,
   a voltage node configured to generate a voltage based on the clock input,
   a diode connected to the voltage node, wherein the voltage generated by the voltage node is proportional to a threshold voltage of the diode, the threshold voltage of the diode being based on a process state of the diode, and a contention P-type Metal Oxide Semiconductor (PMOS) configured to create a delay in a reset time of the internal clock according to the voltage generated at the voltage node of the diode.

2. The delay tuning circuitry of claim 1, wherein the process state comprises one of a fast process or a slow process, the fast process being faster than the slow process.

3. The delay tuning circuitry of claim 2, wherein the threshold voltage of the diode is at a first level when the process state of the diode is the fast process, and is at a second level when the process state of the diode is the slow process, the second level being greater in absolute value than the first level.

4. The delay tuning circuitry of claim 1, wherein the process state of the diode corresponds to at least one of an ion implantation condition associated with a fabrication of the diode or a photolithographic condition associated with the fabrication of the diode.

5. The delay tuning circuitry of claim 1, wherein the process sensing circuitry includes,
a first transistor having a drain connected to a power supply, a gate connected to the clock input, and a source connected to the voltage node.

6. The delay tuning circuitry of claim 5, wherein the first transistor is a PMOS transistor.

7. The delay tuning circuitry of claim 1, wherein the diode includes,
a second transistor having a drain connected to the voltage node, a source connected to a ground terminal, and a gate and a source, wherein the gate of the second transistor is connected to the source of the second transistor.

8. The delay tuning circuitry of claim 7, wherein the second transistor is a PMOS transistor.

9. The delay tuning circuitry of claim 7, wherein the gate of the second transistor and the source of the second transistor are connected to a ground terminal.

10. The delay tuning circuitry of claim 7, wherein the threshold voltage of the diode corresponds to the threshold voltage of the second transistor.

11. The delay tuning circuitry of claim 7, wherein the process state of the diode corresponds to a fabrication condition of the second transistor.

12. The delay tuning circuitry of claim 11, wherein the fabrication condition of the second transistor corresponds to at least one of an ion implantation condition of the second transistor or a gate length of the second transistor.

13. The delay tuning circuitry of claim 1, further comprising:
a third transistor having a source connected to the voltage node, a gate configured to receive the clock input, and a drain connected to a ground terminal.

14. The delay tuning circuitry of claim 13, wherein the third transistor is an NMOS transistor.

15. A delay control circuitry in a Static Random-Access Memory (SRAM), the delay control circuitry comprising:
a Dummy Bit Line (DBL) circuitry connected to one or more DBL loads;
a Complementary Dummy Bit Line (CDBL) circuitry connected to one or more CDBL loads;
a pass gate configured to enable a discharging state for the DBL circuitry and for the CDBL circuitry;
a stack of NMOS transistors connected to the DBL circuitry, the stack of NMOS transistors configured to control a delay in generation of an internal clock according to a rate of discharge of each of the DBL circuitry and of the CDBL circuitry; and
a dummy word line (DWL) circuitry connected to the stack of NMOS transistors and to a ground, the DWL circuitry configured to trigger the stack of NMOS transistors.

16. The delay control circuitry of claim 15, wherein the pass gate is configured to control the discharge state of each of the DBL circuitry and the CDBL circuitry by disconnecting at least one of the one or more DBL loads and the one or more CDBL loads through one or more select signals.

17. The delay control circuitry of claim 16, wherein the one or more select signals are generated according to a change in delay settings in the SRAM.

18. The delay control circuitry of claim 15, wherein each of the DBL circuitry and the CDBL circuitry comprises one or more NMOS transistors.

19. The delay control circuitry of claim 15, wherein a Margin Control Setting (MCS) pin is configured to control the delay in a reset timing of the internal clock by enabling one or more NMOS transistors in the NMOS transistor stack.

20. A Static Random-Access Memory (SRAM), comprising:
a process sensing circuitry; and
a delay control circuitry;
the process sensing circuitry including,
an input clock configured to generate a clock input based on an internal clock,
a voltage node configured to generate a voltage based on the clock input,
a diode connected to the voltage node, wherein the voltage generated by the voltage node is proportional to a threshold voltage of the diode, the threshold voltage of the diode being based on a process state of the diode, and
a contention P-type Metal Oxide Semiconductor (PMOS) configured to create a delay in a reset time of the internal clock according to the voltage generated at the voltage node of the diode, and
the delay control circuitry including,
a Dummy Bit Line (DBL) circuitry connected to one or more DBL load,
a Complementary Dummy Bit Line (CDBL) circuitry connected to one or more loads,
a pass gate configured to control a discharging state for each of the DBL circuitry and the CDBL circuitry, and
a stack of NMOS transistors connected to the DBL circuitry, the stack of NMOS transistors configured to control a delay in a generation of an internal clock according to a rate of discharge of each of the DBL circuitry and the CDBL circuitry.

* * * * *